United States Patent
Striano

(10) Patent No.: US 7,269,024 B2
(45) Date of Patent: Sep. 11, 2007

(54) PRINTED WIRING ASSEMBLY RETAINER

(75) Inventor: Mark V. Striano, Horsham, PA (US)

(73) Assignee: Honeywell International Inc., Morristown, NJ (US)

( * ) Notice: Subject to any disclaimer, the term of this patent is extended or adjusted under 35 U.S.C. 154(b) by 309 days.

(21) Appl. No.: 11/106,853

(22) Filed: Apr. 15, 2005

(65) Prior Publication Data

US 2006/0232951 A1    Oct. 19, 2006

(51) Int. Cl.
*H05K 7/12* (2006.01)

(52) U.S. Cl. ............... 361/759; 361/801; 361/747; 361/726; 312/223.2

(58) Field of Classification Search ........... 361/796, 361/801, 752, 756, 726, 747, 759; 312/223.2, 312/223.3
See application file for complete search history.

(56) References Cited

U.S. PATENT DOCUMENTS

| | | | |
|---|---|---|---|
| 4,268,100 A | | 5/1981 | Kekas et al. |
| 5,694,291 A | * | 12/1997 | Feightner .................. 361/683 |
| 5,947,571 A | * | 9/1999 | Ho ........................... 312/265.6 |
| 6,231,139 B1 | | 5/2001 | Chen |
| 6,788,550 B1 | * | 9/2004 | Dean et al. ................. 361/801 |
| 2002/0030976 A1 | | 3/2002 | Boe |
| 2004/0150973 A1 | | 8/2004 | Junkins et al. |
| 2004/0170007 A1 | | 9/2004 | Chen |
| 2004/0212975 A1 | | 10/2004 | Chen et al. |

OTHER PUBLICATIONS

"Engineers' Design Manual for Printed Circuit Card Enclosures", www.esfinc.com, Electro-Space Fabricators, Inc.,(May 1998),3 pages.

* cited by examiner

*Primary Examiner*—Dean A. Reichard
*Assistant Examiner*—Dameon E. Levi
(74) *Attorney, Agent, or Firm*—Schwegman, Lundberg, Woessner & Kluth, P.A.

(57) ABSTRACT

A retainer secures one or more printed wiring assemblies in a processor unit. In one embodiment, the retainer has one or more protuberances that abut against a wiring assembly to secure it in place, or sit within a cutout section in the wiring assembly to secure the assembly in a serviceable position.

18 Claims, 6 Drawing Sheets

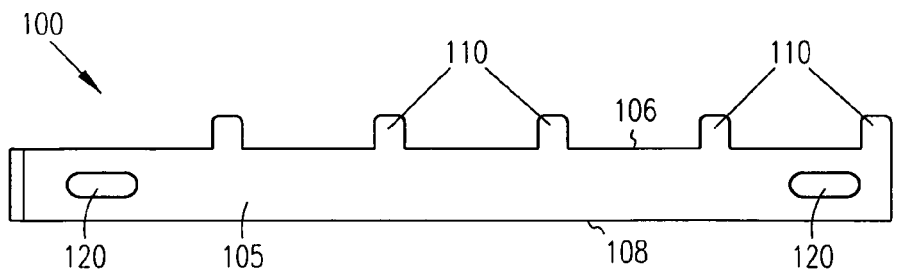
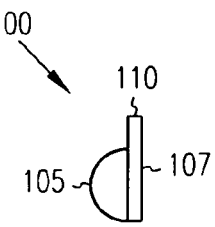
FIG. 1A  FIG. 1B
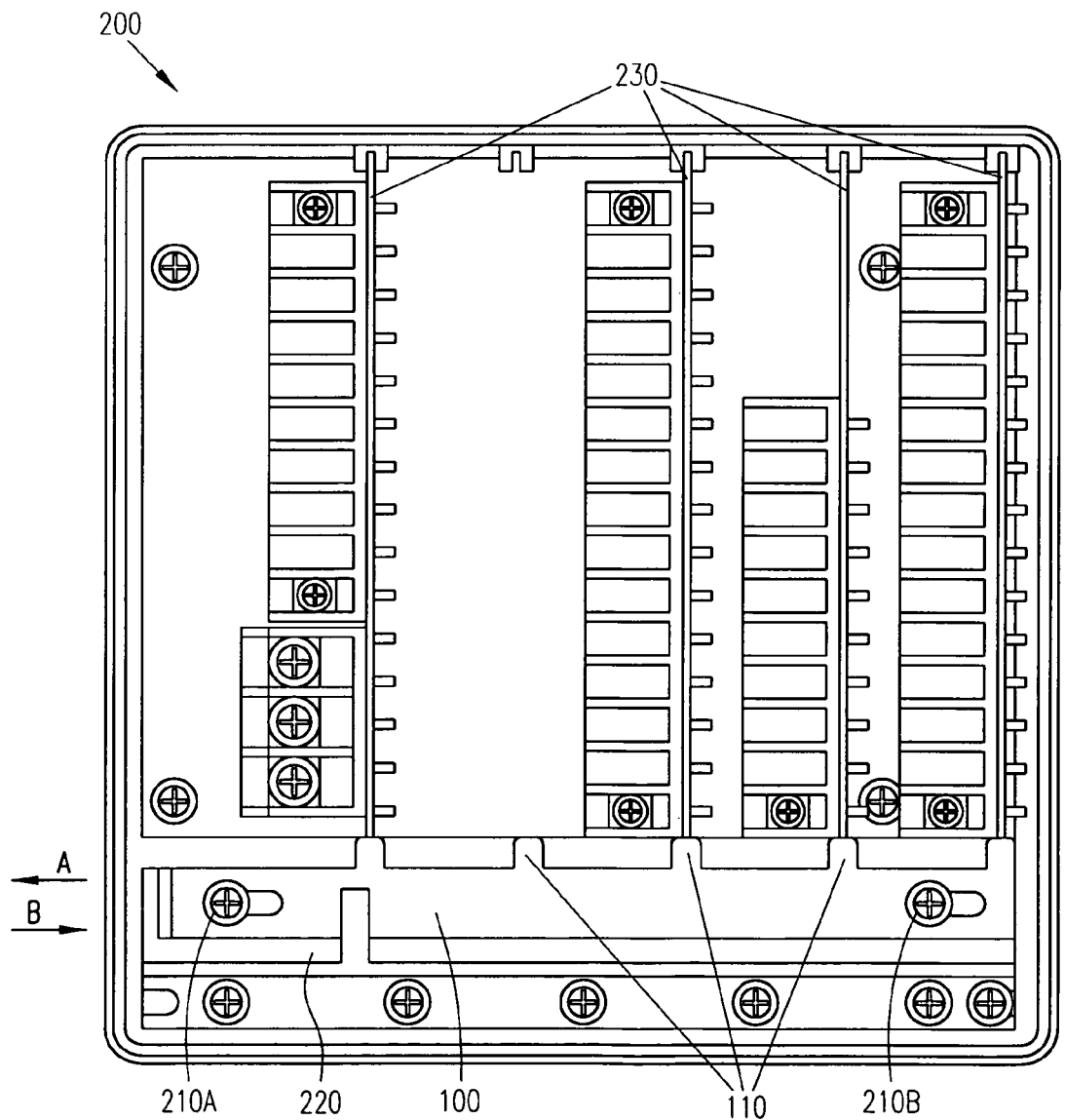
FIG. 2A

PRINTED WIRING ASSEMBLY RETAINER

TECHNICAL FIELD

The invention relates to printed wiring assemblies, and in particular, a retainer system for such assemblies.

BACKGROUND

Many computer systems have their processors, memories and other integrated circuits and components mounted on a printed wiring assembly (PWA). These assemblies normally slide in a track or groove in a housing and connect to a mother board. After insertion into the housing, the housing is closed before the unit is placed into operation. This is referred to in the art as the operational mode. If problems arise with the unit, the unit is re-opened, and one or more of the assemblies removed for servicing and/or replacement. An assembly can be completely removed from the housing, or just partially removed to expose the components that have to be serviced. This is referred to in the art as the serviceable mode.

Problems can arise however in both the operational and serviceable modes. In the operational mode, vibration of the housing can cause the printed wiring assembly to disconnect from the mother board. In the serviceable mode, if the printed wiring assembly is partially removed from the housing, it could fall out at some point during the maintenance causing damage to the assembly. Consequently, the art would benefit from a system that could secure a printed wiring assembly in both the operational and serviceable modes.

BRIEF DESCRIPTION OF THE DRAWINGS

FIG. 1a illustrates a front view of an example embodiment of the invention.

FIG. 1b illustrates a side view of an example embodiment of the invention.

FIG. 2a illustrates a front view of an example embodiment of the invention installed on a processor unit in operational mode.

DETAILED DESCRIPTION

Figure 2B:
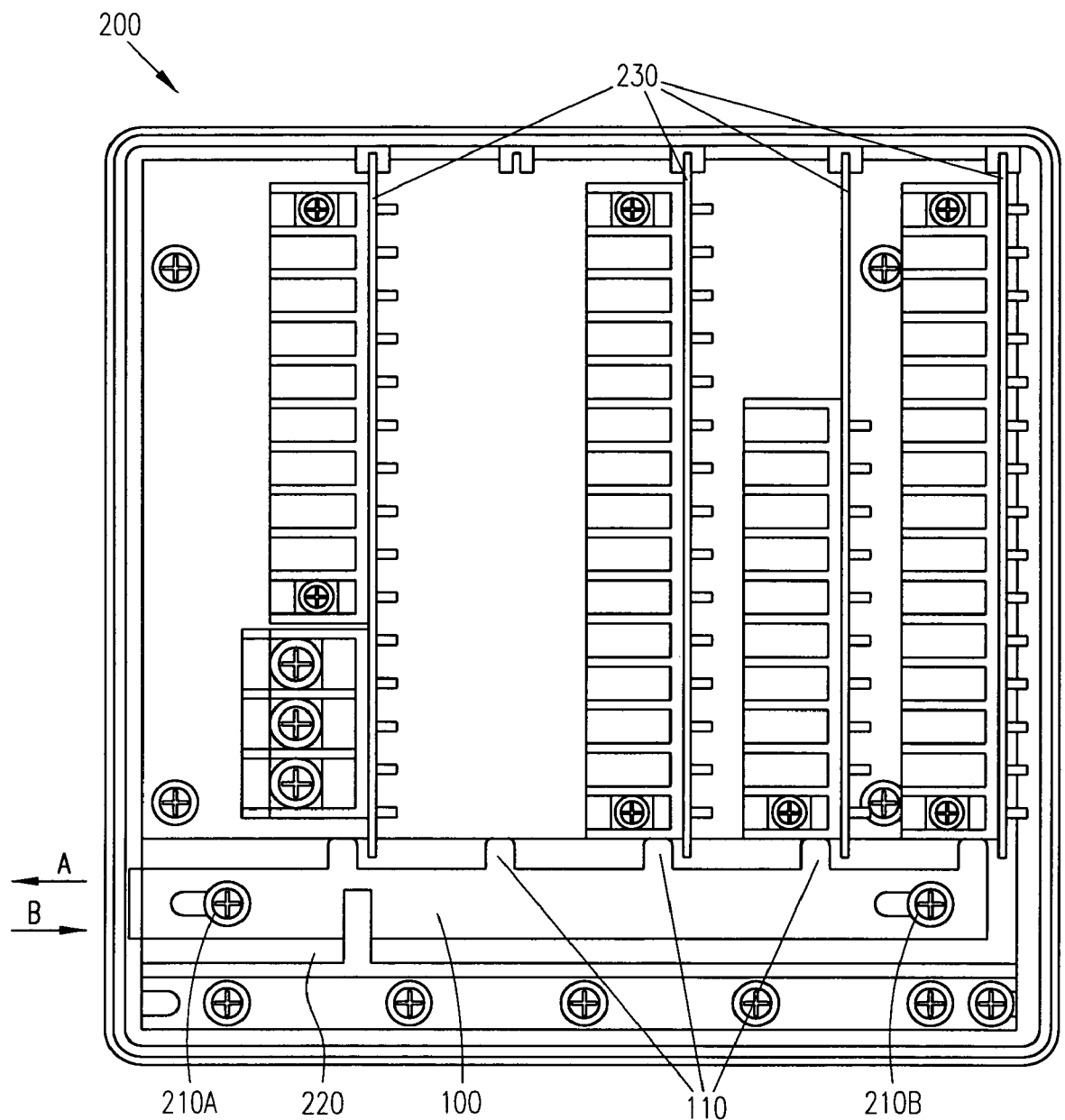
FIG. 2b illustrates a front view of an example embodiment of the invention installed on a processor unit in serviceable mode.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1a illustrates a front view of an embodiment of a printed wiring assembly retainer. A longitudinal retainer 100 has one or more protuberances 110. It has a front face 105, a rear face 107, a first longitudinal edge 106, and a second longitudinal edge 108. The retainer 100 further has one or more slots 120. FIG. 1b illustrates a side view of the retainer 100, illustrating that in this embodiment the front face 105 of the retainer 100 has a curvilinear shape, and the one or more protuberances 110 have a generally rectangular shape. One of skill in the art will realize however that other shapes will also work quite well.

Figure 5:
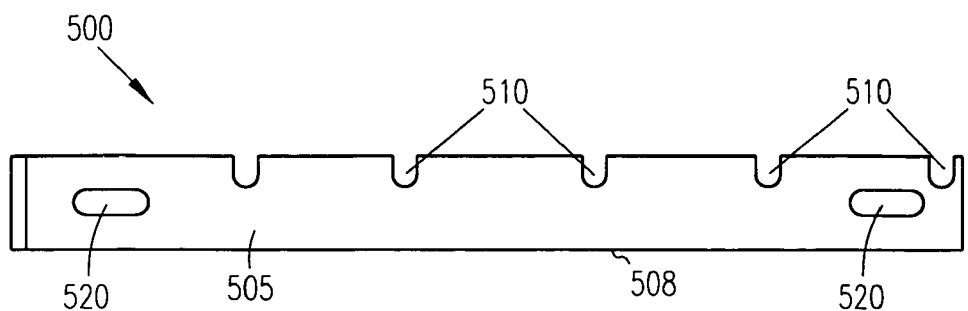
FIG. 5 illustrates a front view of another example embodiment of the invention.

FIG. 5 illustrates a front view of another embodiment of a printed wiring assembly retainer. FIG. 5 illustrates a retainer 500 having a front face 505, a first longitudinal side 506 and a second longitudinal side 508. The body 505 has within it one or more openings 520. Disposed along longitudinal edge 506 are one or more slots 510.

Figure 6A:
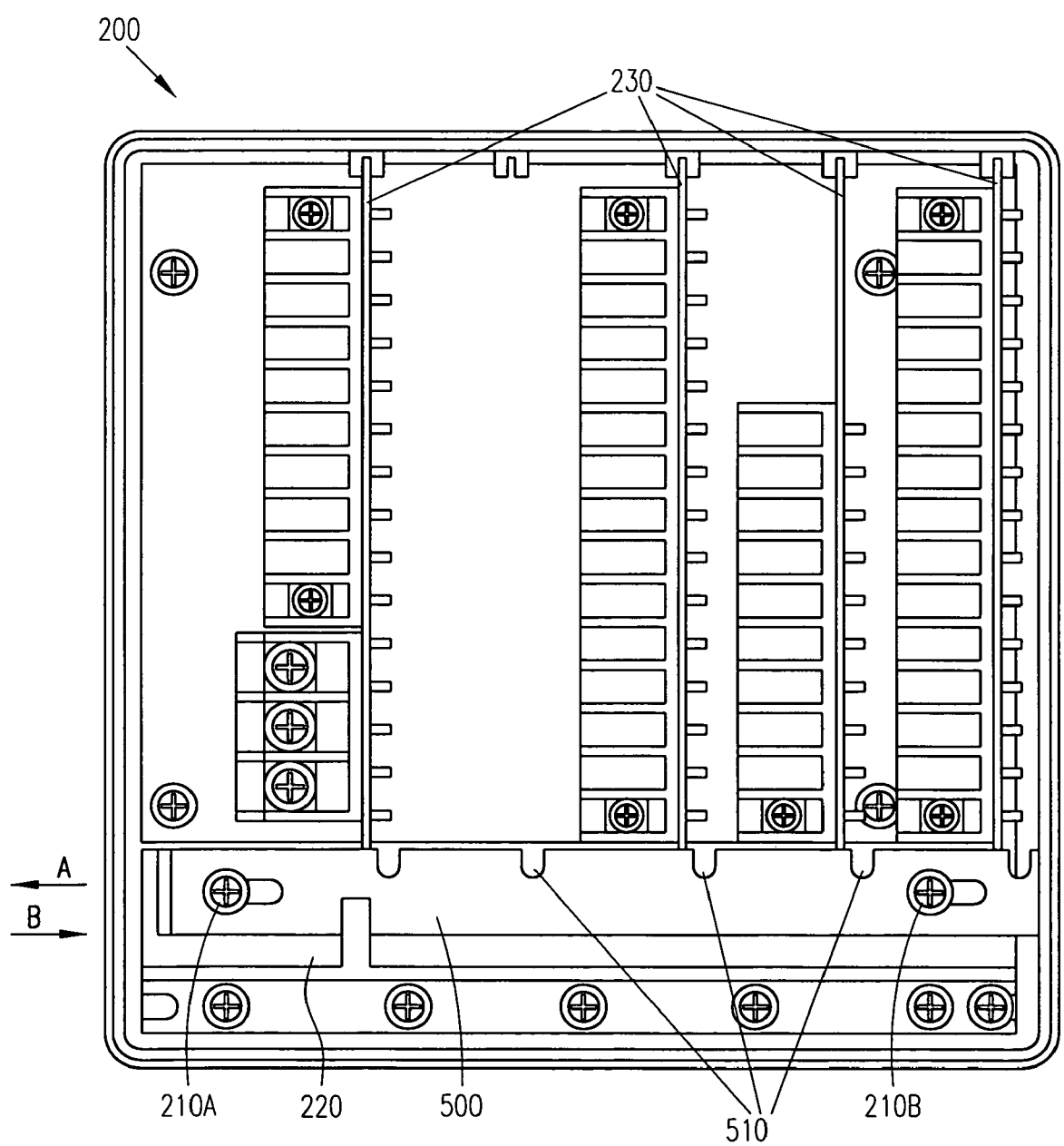
FIG. 6a illustrates a front view of the example embodiment of FIG. 5 installed on a processor unit in operational mode.

FIG. 2a shows an embodiment installed onto a processor unit 200 having one or more printed wiring assemblies 230. The retainer 100 is held in place by screws 210a and 210b. The screws 210a and 210b screw into a support structure 220 that may be an integral part of the unit or it may be an attachment to the unit. FIG. 2a shows the protuberances 110 in line with the assembly boards 230, illustrating that the protuberances are for abutting against the assembly boards 230. Consequently, the retainer 100 in FIG. 2a is in the operational position, i.e. the protuberances 110 are holding the printed wiring assemblies in their operational position coupled to a mother board or other connecting component. In the embodiment of FIG. 5, to hold the assembly boards in the operational position, the slots 506 are not in line with the assembly boards, and as shown in FIG. 6a, the body of the retainer 500 holds the assembly boards in place.

Figure 6B:
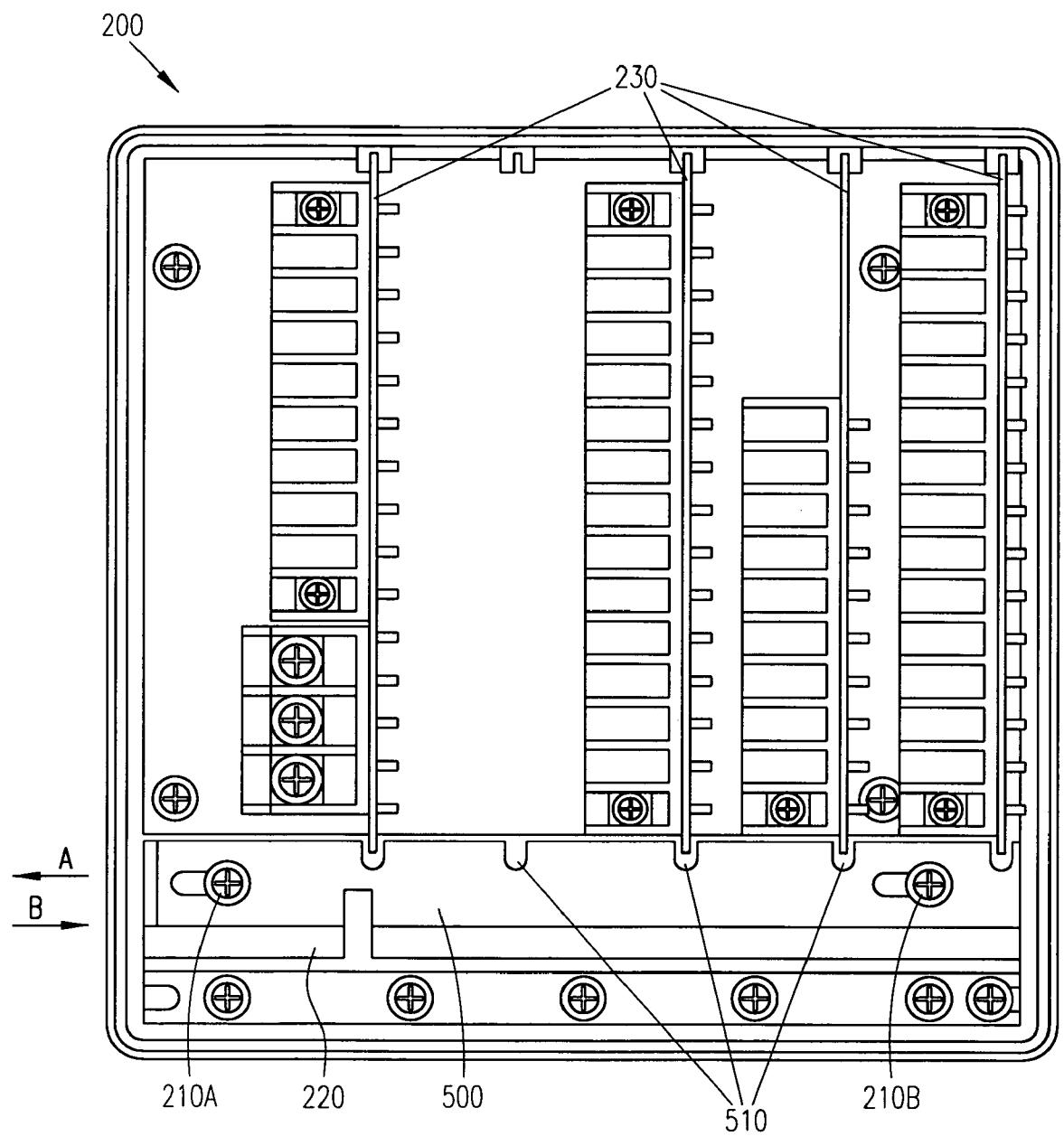
FIG. 6b illustrates a front view of the example embodiment of FIG. 5 installed on a processor unit in serviceable mode.

FIG. 2b is similar to FIG. 2a, except that the retainer 100 is in the serviceable position. That is, the screws 210a and 210b have been loosened, and in this embodiment the retainer 100 has been moved in the direction of arrow A, thereby moving the protuberances 110 out of line from the assembly boards 230, and allowing the assembly boards to slide out of the unit 200. In the embodiment of FIG. 5, to place an assembly board in the serviceable position, the retainer 500 is moved so that the slots 506 are in line with the assembly board, and as shown in FIG. 6b, the assembly board can slide through the slot 510 to place the assembly board in the serviceable position.

Figure 3:
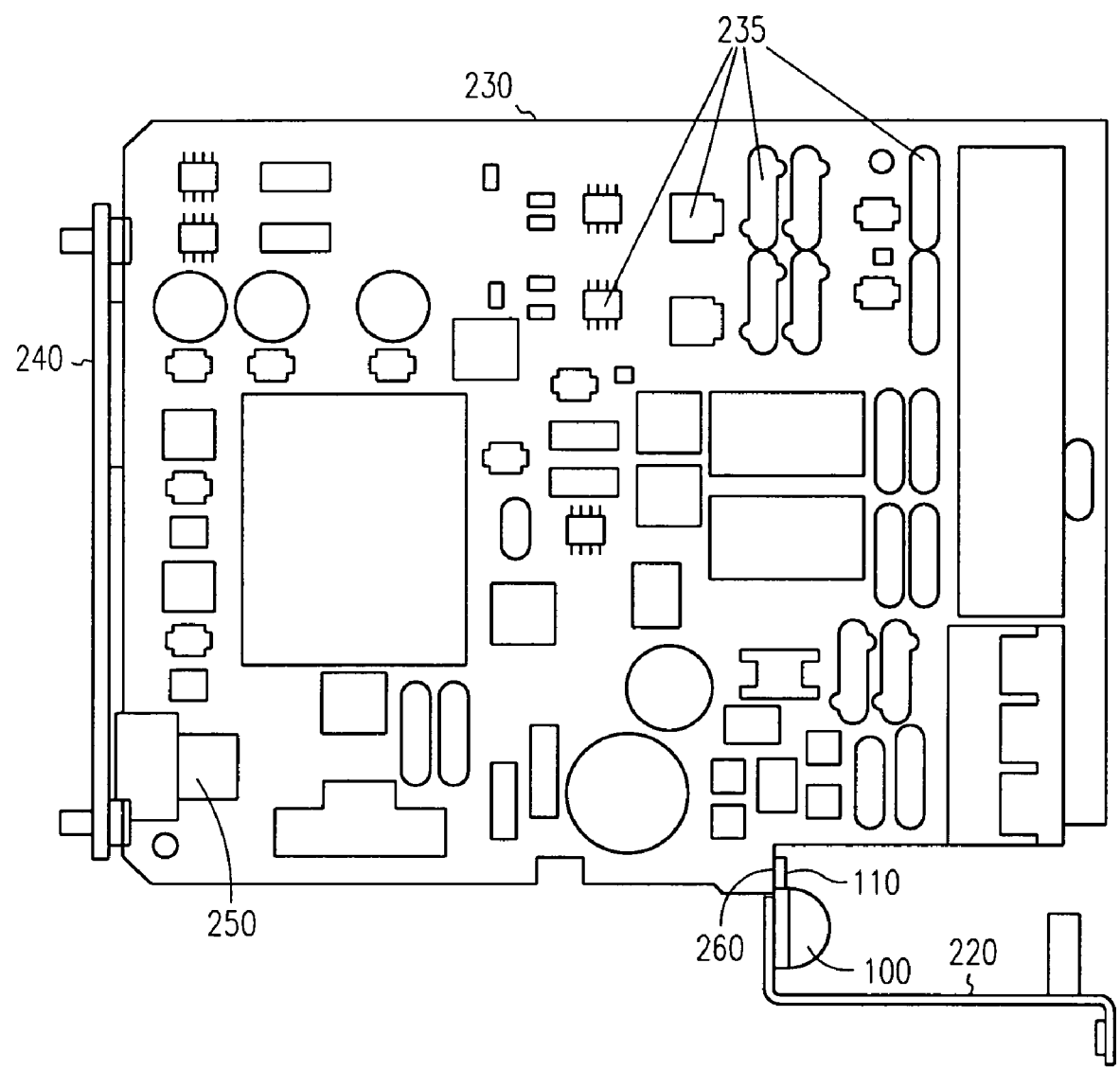
FIG. 3 illustrates a side view of an example embodiment of the invention in an operational mode.

FIG. 3 illustrates a side view of an embodiment of the invention in operational mode. Specifically, FIG. 3 illustrates the printed wiring assembly board 230 with its plurality of components 235 coupled to a mother board 240 via connector 250. The retainer 100 holds the assembly 230 in place via the seating of the protuberance 110 onto a shoulder 260 of the assembly board 230. Referring back to FIG. 1, to put the retainer 100 into the operational mode as illustrated in FIG. 3, the retainer 100 is moved in the direction of arrow B until the screws 210a and 210b abut against the end of their respective slots 120. This places the protuberances in line with the one or more assembly boards 230, and the screws 210a and 210b are tightened to secure the assembly board in place.

Figure 4:
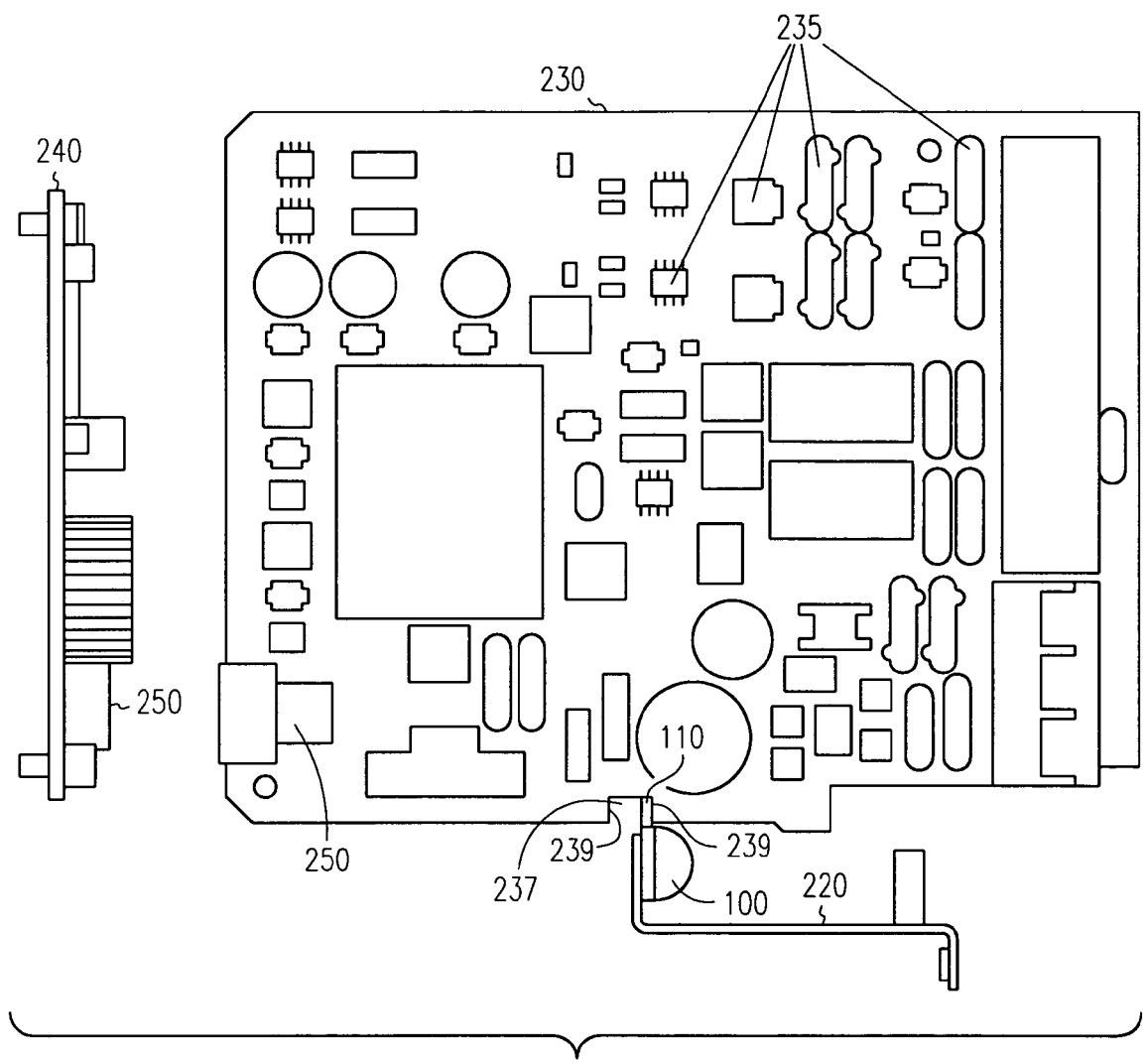
FIG. 4 illustrates a side view of an example embodiment of the invention in a serviceable mode.

FIG. 4 illustrates a side view of an embodiment of the invention in serviceable mode. FIG. 4 shows the assembly board 230 with its plurality of circuit components 235 separated from the mother board 240. FIG. 4 further illustrates the protuberance 110 of the retainer 100 positioned within a cutout section 237. By this positioning, the protuberance 110 prevents the assembly board 230 from moving more than the distance of the width of the cutout section 237. The assembly 230 is thereby secured in a serviceable position via the contact of the protuberance 110 with the edges 239 of the cut away section 237. The assembly 230 can then be serviced without completely removing the assembly board 230 from the unit 200, and without the danger of the assembly board falling out of the unit while the assembly board is being serviced.

The steps involved in transforming the assembly board 230 from the operational position of FIG. 3 to the serviceable mode of FIG. 4 is as follows. The screws 210a and 210b are loosened, and the retainer 100 is moved in the direction of arrow A in FIG. 2a so that the protuberances 110 fall out of line from the assembly boards 230. An assembly board 230 is then pulled to disconnect it from the mother board 240, and to move it out of the unit 200. When the cutout section 237 is in line with the protuberance 110, the retainer 100 is moved in the direction of arrow B in FIG. 2a so that the protuberance 110 moves within the cutout section 237, and the screws 210a and 210b are tightened to secure the assembly board in the serviceable position.

In the foregoing detailed description of embodiments of the invention, various features are grouped together in one or more embodiments for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

The invention claimed is:

1. An article comprising:
   a longitudinal body, said longitudinal body having a first longitudinal edge;
   an opening in said body; and
   a protuberance on said first longitudinal edge;
   wherein said opening is for receiving a fastening device;
   wherein said fastening device is for securing said longitudinal body to a processor unit;
   wherein said opening permits said fastening device to move from a first end of said opening to a second end of said opening, thereby permitting said article to move perpendicularly in relation to a printed wiring assembly within said processor unit; and
   further wherein said protuberance is for abutting against said printed wiring assembly, thereby holding said printed wiring assembly in a first position.

2. The article of claim 1, wherein said protuberance is for positioning within a cutout section of said printed wiring assembly.

3. The article of claim 1, wherein said longitudinal body is attached to said processor unit with said fastening device, and further wherein said first position comprises said protuberance abutting against said printed wiring assembly and securing said printed wiring assembly in an operational mode.

4. The article of claim 1, further comprising a cutout section in said printed wiring assembly, wherein said protuberance is within said cutout section, thereby holding said printed wiring assembly in a second position.

5. The article of claim 4, wherein said second position comprises said printed wiring assembly in a serviceable mode electrically disconnected from said processor unit.

6. The article of claim 1, wherein said longitudinal body comprises a plurality of said protuberances on said first longitudinal edge.

7. The article of claim 6, further comprising a plurality of said printed wiring assemblies, wherein said plurality of protuberances are for abutting against said plurality of printed wiring assemblies.

8. A system comprising:
   a processor unit;
   a connector attached to said processor unit;
   a printed wiring assembly coupled to said connector; and
   a retainer comprising a longitudinal body, a protuberance positioned on a longitudinal edge of said retainer, and an opening for receiving a fastening device to connect said retainer to said processor unit;
   wherein said opening permits said fastening device to move from a first end of said opening to a second end of said opening, thereby permitting said retainer to move perpendicularly in relation to the printed wiring assembly within said processor unit;
   wherein said retainer is configured to abut against said printed wiring assembly in an operational mode; and
   wherein said processor unit is configured to permit said printed wiring assembly to move over said retainer in a serviceable mode.

9. The system of claim 8, further comprising a shoulder along an edge of said printed wiring assembly, wherein said protuberance of said retainer abuts against said shoulder to secure said printed wiring assembly in an operational position.

10. The system of claim 8, further comprising a cutout section along an edge of said printed wiring assembly, wherein said protuberance of said retainer is positioned within said cutout section to secure said printed wiring assembly in a serviceable position.

11. The system of claim 8, further comprising a plurality of said protuberances positioned on said longitudinal edge of said retainer.

12. The system of claim 11, further comprising a plurality of said printed wiring assemblies, wherein said plurality of protuberances abut against said plurality of printed wiring assemblies.

13. The system of claim 8, further comprising a slot in said retainer, said retainer positioned such that said slot is in line with said printed wiring assembly, thereby allowing removal of said printed wiring assembly.

14. A system comprising:
a processor unit;
a mother board connected to said processor unit;
a printed wiring assembly coupled to said mother board, said printed wiring assembly comprising a shoulder along an edge of said printed wiring assembly, and said printed wiring assembly further comprising a cutout section along said edge of said printed wiring assembly; and
a retainer connected to said processor unit, said retainer comprising a longitudinal body, a slot in said longitudinal body, a fastening device positioned within said slot, and a protuberance positioned on a longitudinal edge of said body;
wherein said slot permits said fastening device to move from a first end of said slot to a second end of said slot, thereby permitting said retainer to move perpendicularly in relation to said printed wiring assembly within said processor unit;
wherein said protuberance of said retainer abuts against said shoulder to secure said printed wiring assembly in an operational position; and
wherein said processor unit is configured to permit said printed wiring assembly to move over said retainer in a serviceable position.

15. The system of claim 14, wherein said protuberance of said retainer is positioned within said cutout section to secure said printed wiring assembly in a serviceable position.

16. The system of claim 14, further comprising a plurality of protuberances positioned on said longitudinal edge of said body.

17. The system of claim 16, further comprising a plurality of said printed wiring assemblies, wherein said plurality of protuberances abut against said plurality of printed wiring assemblies.

18. The apparatus of claim 1, wherein said opening comprises a longitudinal axis.

* * * * *